(12) United States Patent
Cuijpers et al.

(10) Patent No.: US 6,473,161 B2
(45) Date of Patent: Oct. 29, 2002

(54) LITHOGRAPHIC PROJECTION APPARATUS, SUPPORTING ASSEMBLY AND DEVICE MANUFACTURING METHOD

(75) Inventors: Martinus Agnes Willem Cuijpers, Stramproij (NL); Frank Auer, Eindhoven (NL); Robertus Nicodemus Jacobus van Ballegoij, Eindhoven (NL)

(73) Assignee: ASML Netherlands B.V. (NL)

( * ) Notice: Subject to any disclaimer, the term of this patent is extended or adjusted under 35 U.S.C. 154(b) by 24 days.

(21) Appl. No.: 09/866,913

(22) Filed: May 30, 2001

(65) Prior Publication Data

US 2002/0005939 A1 Jan. 17, 2002

(30) Foreign Application Priority Data

Jun. 2, 2000 (EP) ............................................. 00304713

(51) Int. Cl.⁷ ........................ G03B 27/42; G03B 27/52; G03B 27/32; G03F 9/00; G01B 11/02
(52) U.S. Cl. ............................ 355/53; 355/55; 355/72; 355/75; 355/76; 355/73; 355/77; 430/22; 430/311; 356/358; 356/363; 356/399
(58) Field of Search ............................. 355/53, 55, 72, 355/75, 76, 73, 77; 430/22, 311; 356/399, 358, 363

(56) References Cited

U.S. PATENT DOCUMENTS

| | | | | |
|---|---|---|---|---|
| 4,818,838 A | * | 4/1989 | Young et al. | |
| 5,959,732 A | * | 9/1999 | Hara et al. | |
| 6,226,075 B1 | * | 5/2001 | Loopstra et al. | |
| 6,316,901 B2 | * | 11/2001 | Lee | |
| 6,323,935 B1 | * | 11/2001 | Ebihara et al. | |
| 6,351,041 B1 | * | 2/2002 | Okubo | |

* cited by examiner

Primary Examiner—Russell Adams
Assistant Examiner—Khaled Brown

(57) ABSTRACT

A supporting assembly for use in a lithographic projection apparatus includes a moveable member which is journalled in a housing such that substantially no vibration forces are transmitted between the moveable member and the housing. The assembly comprises a gas filled pressure chamber in which the gas in the pressure chamber acts on the moveable member so as to at least partially counteract the force due to the weight of the moveable member and any other object which it carries. The pressure chamber is supplied with gas and the whole assembly is constructed and arranged such that substantially no gas flows through the pressure chamber when the moveable member is substantially stationary. The supporting assembly may be applied to a lithographic projection apparatus, object table, or metrology frame.

12 Claims, 6 Drawing Sheets

LITHOGRAPHIC PROJECTION APPARATUS, SUPPORTING ASSEMBLY AND DEVICE MANUFACTURING METHOD

BACKGROUND OF THE INVENTION

1. Field of the Invention

The present invention relates generally to a lithographic projection apparatus and more specifically to a lithographic projection apparatus supporting assembly.

2. Background of the Related Art

For the sake of simplicity, the projection system may hereinafter be referred to as the "lens"; however, this term should be broadly interpreted as encompassing various types of projection system, including refractive optics, reflective optics, catadioptric systems, and charged particle optics, for example. The projection system may also include elements operating according to any of these principles for directing, shaping or controlling the projection beam, and such elements may also be referred to below, collectively or singularly, as a "lens". In addition, the first and second object tables may be referred to as the "mask table" and the "substrate table", respectively.

In the present document, the terms "radiation" and "beam" are used to encompass all types of electromagnetic radiation or particle flux, including, but not limited to, ultraviolet radiation (e.g. at a wavelength of 365 nm, 248 nm, 193 nm, 157 nm or 126 nm), extreme ultraviolet radiation (EUV), X-rays, electrons and ions. Also herein, the invention is described using a reference system of orthogonal X, Y and Z directions and rotation about an axis parallel to the I-direction is denoted Ri. Furthermore, unless the context otherwise requires, the term "vertical" (Z) used herein is intended to refer to the direction normal to the substrate or mask surface, rather than implying any particular orientation of the apparatus. Similarly, the term "horizontal" refers to a direction parallel to the substrate or mask surface, and thus normal to the "vertical" direction.

Lithographic projection apparatus can be used, for example, in the manufacture of integrated circuits (ICs). In such a case, the mask (reticle) may contain a circuit pattern corresponding to an individual layer of the IC, and this pattern can be imaged onto an exposure area (die) on a substrate (silicon wafer) which has been coated with a layer of photosensitive material (resist). In general, a single wafer will contain a whole network of adjacent dies which are successively irradiated via the reticle, one at a time. In one type of lithographic projection apparatus, each die is irradiated by exposing the entire reticle pattern onto the die at once; such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally <1), the speed V at which the wafer table is scanned will be a factor M times that at which the reticle table is scanned. More information with regard to lithographic devices as here described can be gleaned from International Patent Application WO97/33205, for example.

Until very recently, lithographic apparatus contained a single mask table and a single substrate table. However, machines are now becoming available in which there are at least two independently moveable substrate tables; see, for example, the multi-stage apparatus described in International Patent Applications WO98/28665 and WO98/40791. The basic operating principle behind such multi-stage apparatus is that, while a first substrate table is at the exposure position underneath the projection system for exposure of a first substrate located on that table, a second substrate table can run to a loading position, discharge a previously exposed substrate, pick up a new substrate, perform some initial measurements on the new substrate and then stand ready to transfer the new substrate to the exposure position underneath the projection system as soon as exposure of the first substrate is completed; the cycle then repeats. In this manner it is possible to increase substantially the machine throughput, which in turn improves the cost of ownership of the machine. It should be understood that the same principle could be used with just one substrate table which is moved between exposure and measurement positions.

EP-0,973,067-A discloses a supporting assembly for supporting a structure, such as the first or second object table or a reference, or metrology, frame, against gravity. The assembly comprises a piston associated with the supported structure and further comprises a cylindrical housing in which the piston is journalled. Gas bearings are provided in between the housing and the piston for providing a frictionless movement of the piston in its housing. The housing comprises a gas-filled pressure chamber and the gas in the chamber acts on the piston so as to counteract the weight of the supported structure. Gas from the pressure chamber is supplied to the gas bearing and may escape from the pressure chamber through a gap between the piston and its housing.

In the device described in EP-0,973,067-A it may be difficult to keep the pressure in the pressure chamber entirely constant. In practice, the pressure maintained in the pressure chamber will have a time varying component. This time varying, or dynamic component is due largely to the fact that gas is flowing from the pressure chamber to the various gas bearings. This flow induces pressure variations in the pressure chamber superimposed over the nominal static force which the pressure chamber must exert in order to counteract the forces of gravity due to the weight of the supported structure. The variations in chamber pressure due to the fact that gas must be supplied to the gas bearings lead to a dynamic pressure variation which can be seen as noise on the static force. This adversely affects the positioning accuracy of the positioning device.

SUMMARY OF THE INVENTION

According to one aspect of the present invention, there is provided a lithographic projection apparatus in which the supporting assembly is constructed and arranged such that substantially no gas flows through the pressure chamber when said moveable member is substantially stationary.

The apparatus of the present invention is constructed so that substantially no vibration forces are transmitted between the moveable member and its housing. This may be achieved by making them physically unconnected. However, in this case, there is necessarily a gap between the moveable member and its housing through which gas from the pressure chamber can escape. This is reduced in the present invention by ensuring that substantially no gas flows through the pressure chamber when the moveable member is stationary. This can be achieved in practice by providing a further gas supply to a further pressure chamber adjacent to the pressure chamber and at least partially surrounding the moveable member, in which the pressure is maintained so as to be substantially identical to that in the pressure chamber.

In one embodiment, the pressure chamber is supplied via a pneumatic resistor, which may include a small gap between the moveable member and a wall connecting the pressure chamber with the further pressure chamber. In this embodiment, the gas supply to the pressure chamber is provided from the further pressure chamber and passes through the pneumatic resistor gap.

Preferably, one or more gas bearings are located between the moveable member and its housing or between the moveable member and the supported structure. These gas bearings conveniently may be supplied via the further pressure chamber.

A gas cylinder as here referred to is sometimes also referred to as a (frictionless) pneumatic cylinder. By using the gas cylinder in the manner described above, the moveable member is supported by a constant pneumatic supporting force that is determined by gas pressure present in the pressure chamber. This gas pressure is not adversely influenced by flow induced pressure variations because the pressure chamber does not supply any flow to the gas bearings and escape of gas from the pressure chamber along the moveable member is prevented by the pressure of the further pressure chamber.

In one aspect of the invention, the gas cylinder, acting as a gravity compensator, functions by providing compressed gas (e.g. air or Nitrogen) which acts upon a cross-section of a moving piston with a fixed projected area in the vertical (or other intended) direction. This area can be provided by a single physical surface, but can also be distributed over a number of physical surfaces, or even be a differential area between two opposing surfaces. The counterbalance force provided by the pressure acting on this area should remain as near constant as possible, irrespective of horizontal, vertical, pitch, yaw or roll motion of the supported structure (e.g. mask or substrate holder), and its point of application should also remain static relative to the supportive part.

Also optionally in accordance with an aspect of the invention, the positioning means or device may be provided with, for example, three gas cylinders and three Z-Lorentz-force motors, each of the Z-Lorentz-force motors exerting, in operation, a substantially dynamic Lorentz force on the second part in the Z-direction, in parallel with the substantially static force provided by the gas cylinder. The three gas cylinders provide, in the Z-direction, a stable and statically determined support of the second part, e.g. against gravitational acceleration. By means of the three Z-Lorentz-force motors, the second part can be displaced in the Z-direction, and rotated about the first axis of rotation and the second axis of rotation. Since each of the gas cylinders can be incorporated as part of the Z-Lorentz-force motor, a practical and compact construction of the positioning device is obtained.

In an embodiment of a positioning device in accordance with the invention, a first part can be displaced relative to a base of the positioning device, at least in the X-direction, by means of a drive unit of the positioning device. In this embodiment, the first part can be displaced relative to the base of the positioning device over relatively large distances with relatively low accuracy by means of said drive unit, while a second part can be displaced with relatively high accuracy over relatively small distances relative to the first part by means of the system of Lorentz-force motors. As a result, the drive unit, which must have relatively large dimensions, may be of a relatively simple type with a relatively small positioning accuracy, while the dimensions of the relatively accurate Lorentz-force motors can be limited.

In a lithographic apparatus according to the invention, at least one of the object tables may be connected to a positioning device as described above, the substrate or mask holder being secured to the second part of the positioning device. The favourable properties of the positioning device in accordance with the invention manifest themselves in a particular way in the lithographic device in accordance with the invention in that transmission of mechanical vibrations from a supporting surface to the substrate or mask holder is precluded as much as possible. This has a favourable effect on the accuracy with which the substrate or mask holder can be positioned relative to the projection system, and on the accuracy with which the pattern or sub-pattern on the mask is imaged onto the substrate.

According to a second aspect of the present invention there is provided a supporting assembly including a moveable member associated with a supported structure, a housing in which said moveable member is journalled, said journalling being such that substantially no vibration forces are transmitted between said moveable member and said housing, a gas-filled pressure chamber, the gas in said pressure chamber acting on said moveable member so as to at least partially counteract the force due to the weight of the supported structure, and a gas supply for supplying gas to said pressure chamber, wherein, the supporting assembly is constructed and arranged such that substantially no gas flows through the pressure chamber when said moveable member is substantially stationary.

According to a further aspect of the invention there is provided a method of manufacturing a device using a lithographic projection apparatus including a radiation system for supplying a projection beam of radiation, a first object table provided with a mask holder for holding a mask, a second object table provided with substrate holder for holding a substrate, and a projection system for imaging irradiated portions of the mask on to target portions of the substrate, including, providing a substrate that is at least partially covered by a layer of radiation-sensitive material, providing a mask that contains a pattern, projecting an image of at least part of the mask pattern onto a target portion of the layer of radiation-sensitive material, providing a moveable member associated with a supported structure, providing a housing in which said moveable member is journalled, said journalling being such that substantially no vibration forces are transmitted between said moveable member and said housing, providing a gas-filled pressure chamber, the gas in said pressure chamber acting on said moveable member so as to at least partially counteract the force due to the weight of the supported structure, supplying gas to the pressure chamber, and ensuring that substantially no gas flows through said pressure chamber when said moveable member is substantially stationary.

In a manufacturing process using a lithographic projection apparatus according to the invention a pattern in a mask is imaged onto a substrate which is at least partially covered by a layer of energy-sensitive material (resist). Prior to this imagine step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), mutualization, oxidation, chemo-mechanical polishing, etc., all intended to finish off an individual layer. If several layers are required, then the whole procedure, or a variant thereof, will have to be repeated for each new layer. Eventually, an array of devices (dies) will be present on the substrate (wafer). These devices are then separated from one another by a technique such as dicing or sawing, when the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", wafer" or "die" in this text should be considered as being replaced by the more general terms mask", "substrate" and "target portion", respectively.

BRIEF DESCRIPTION OF THE DRAWINGS

The present invention will be described below with reference to exemplary embodiments and the accompanying schematic drawings, in which.

In the various drawings, like parts are identified by like reference numerals.

DETAILED DESCRIPTION OF THE INVENTION

Embodiment 1

Figure 1:
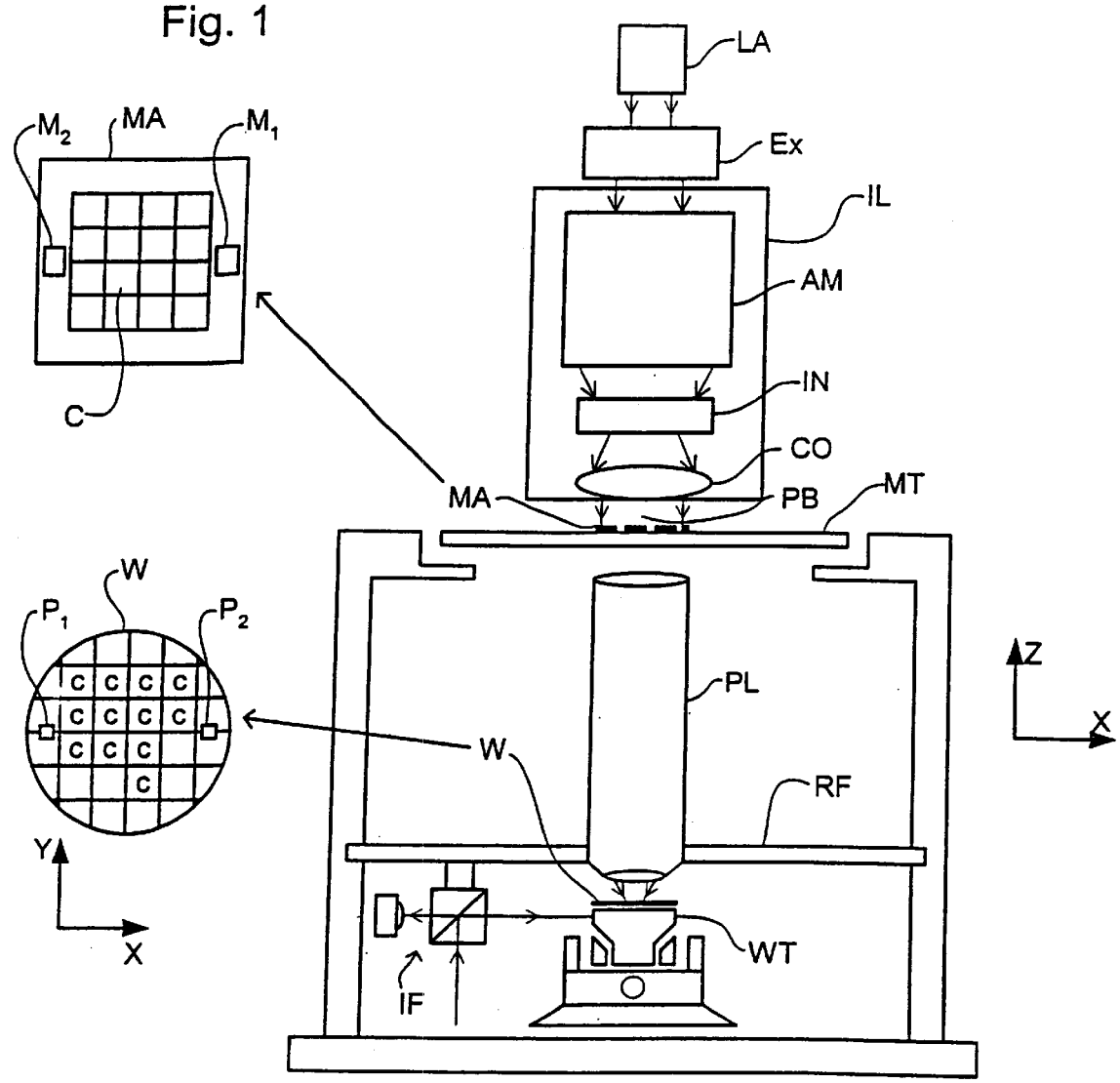
FIG. 1 shows a lithographic projection apparatus according to an embodiment of the invention.

FIG. 1 schematically depicts a lithographic projection apparatus according to a particular embodiment of the invention. The apparatus comprises:

- a radiation system Ex, IL, for supplying a projection beam PB of radiation (e.g. UV or EUV radiation). In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive or catadioptric system, a mirror group or an array of field deflectors) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning means, such as a programmable mirror array of a type as referred to above.

The source LA (e.g. a Hg lamp, an excimer laser, an undulator provided around the path of an electron beam in a storage ring or synchrotron, a laser-produced plasma source or an electron or ion beam source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and Claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Integrated semiconductor circuits to be manufactured by means of the lithographic device have a structure with detail dimensions in the sub-micron range. Since a semiconductor substrate held in the substrate holder is successively exposed via a number of different masks, the patterns present on the masks must be successively imaged onto the semiconductor substrate with an accuracy which is also in the sub-micron range, or even in the nanometer range. To achieve this, between two successive exposure steps, the substrate holder must be positioned with comparable accuracy relative to the projection system PL, and during an exposure step, also the substrate holder and the mask holder must be synchronously displaced relative to the projection system PL with a comparable accuracy. Consequently, the positioning accuracy of the positioning devices for the substrate holder and the mask holder must meet very high requirements.

Figure 2:
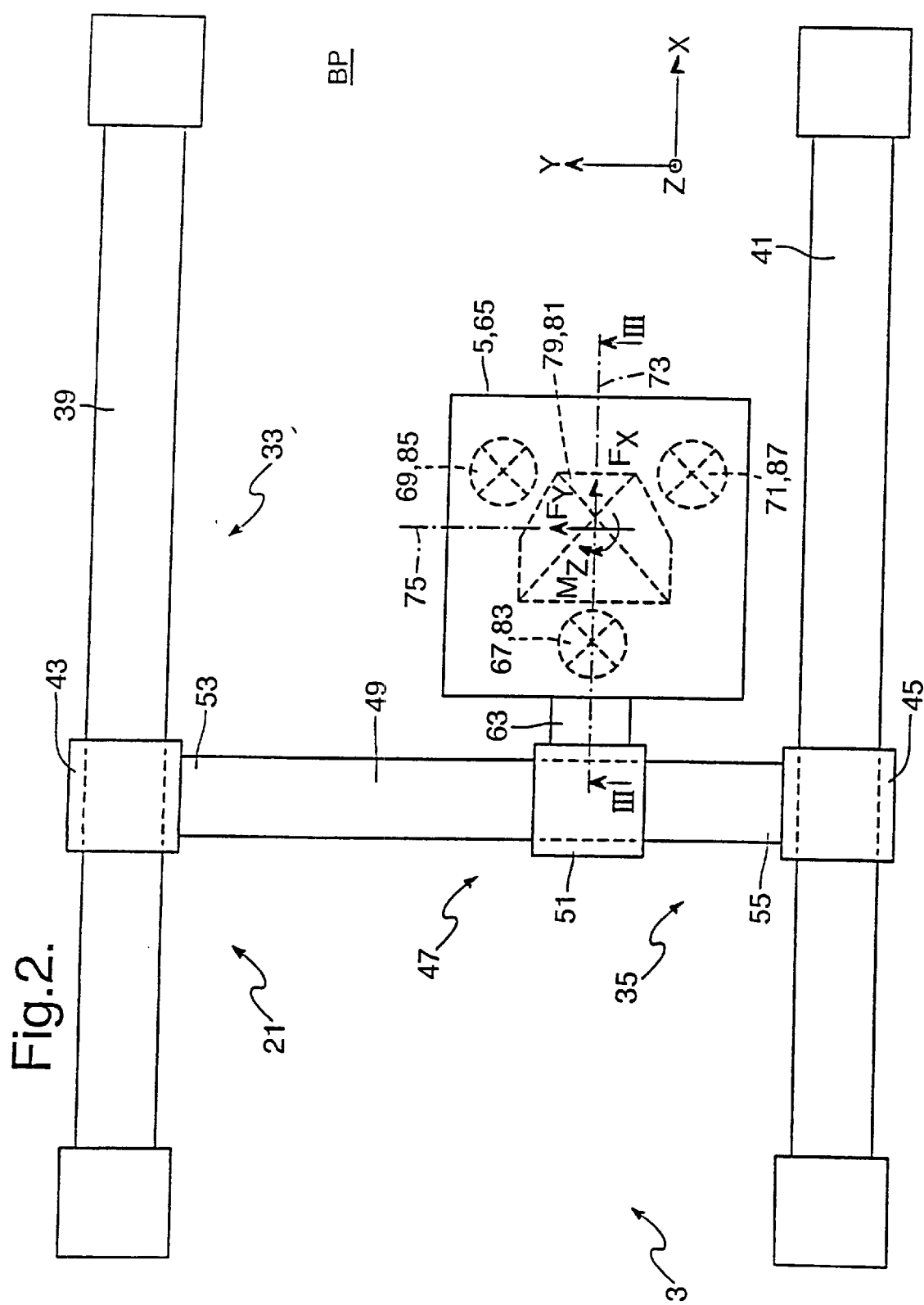
FIG. 2 is a plan view of a positioning device in accordance with the invention, for the substrate holder of the lithographic device shown in FIG. 1.

As shown in FIG. 2, the drive unit 21 of the positioning device 3 in accordance with the invention comprises two linear X-motors 33, 35 which each comprise a stator 39, 41 which extends parallel to the X-direction and is secured to a base BP of the positioning device 3, and a translator 43, 45 which can be moved along the stator 39, 41. The base BP is secured to a base frame BF of the lithographic device. The drive unit 21 further comprises a linear Y-motor 47 which includes a stator 49 which extends parallel to the Y-direction, and a translator 51 which can be moved along the stator 49. The stator 49 is secured, near a first end 53, to the translator 43 of the linear X-motor 33 and, near a second end 55, to the translator 45 of the linear X-motor 35.

Figure 3:
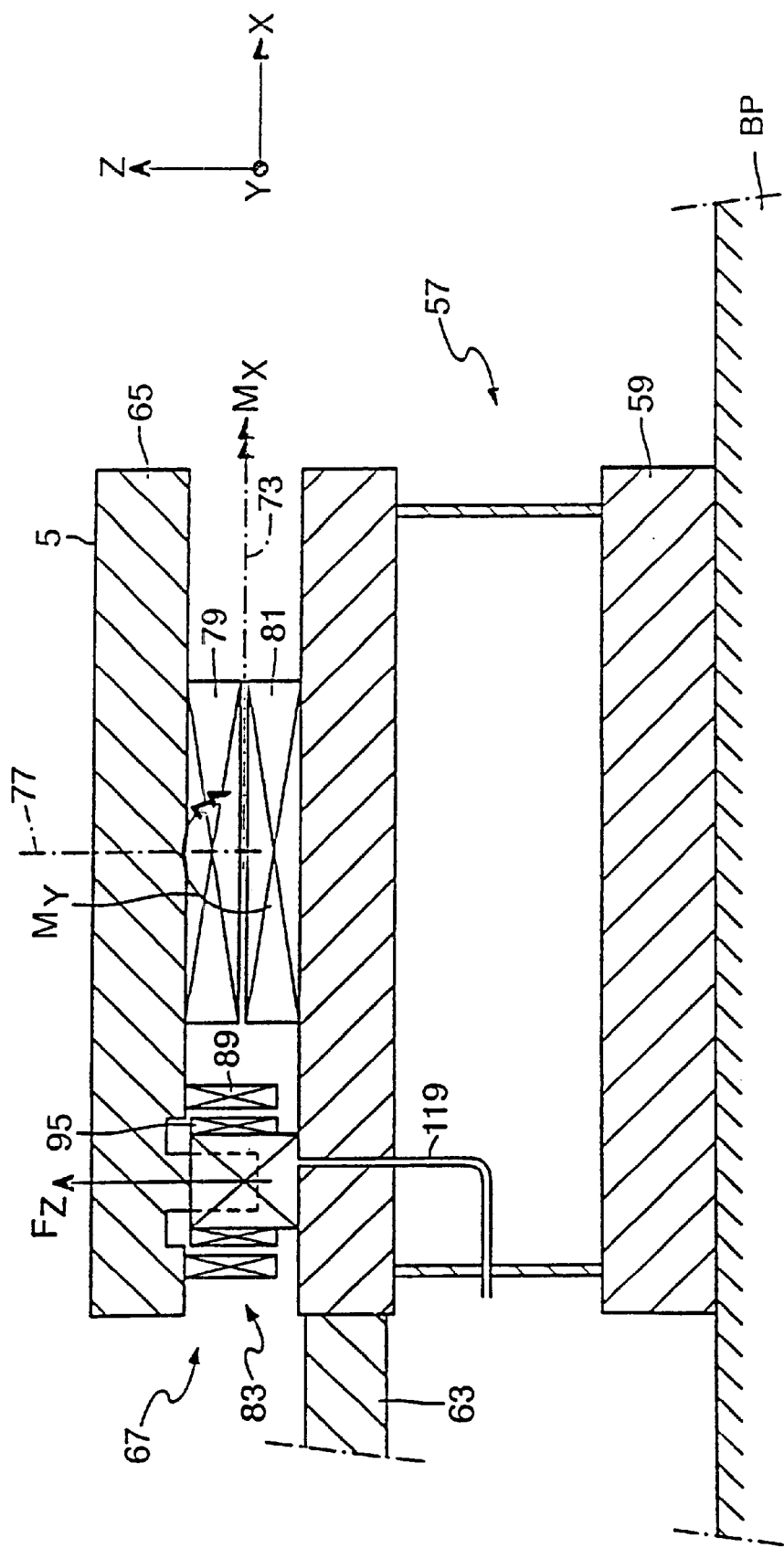
FIG. 3 is a sectional view taken on the line III—III in FIG. 2.

As shown in FIG. 3, the positioning device 3 further includes a first part 57 that is provided with a so-called air foot 59. The air foot 59 comprises a gas bearing (not shown in the Figure for simplicity's sake) by means of which the first part 57 is guided so as to be movable over a guide surface of the base BP extending at right angles to the Z-direction.

As shown in FIGS. 2 and 3, the first part 57 is coupled via a coupling member 63 to the translator 51 of the linear Y-motor 47. The positioning device 3 further includes a second part 65 to which the substrate holder 5 of the lithographic device is secured. The second part 65 is supported relative to the first part 57 in the vertical Z-direction by means of three supporting units 67, 69, 71, which will be described in greater detail below. It can be displaced relative to the first part 57 in the X-, Y- and Z-directions by means of a system of Lorentz-force motors 79, 81, 83, 85, 87, and can be rotated about a first, second and third axes of rotation 73, 75, 77 respectively parallel to the X-, Y- and Z-directions by means of said system of Lorentz-force motors. For this purpose, the system of Lorentz-force motors 79, 81, 83, 85, 87 comprises a system of permanent magnets 79, only diagrammatically shown in FIGS. 2 and 3, which is secured to the second part 65, and a system of electric coils 81, which is secured to the first part 57, for generating a Lorentz-force Fx which is parallel to the X-direction, a Lorentz-force Fy which is parallel to the Y-direction, and a Lorentz-force torque Mz about the third axis of rotation 77.

The system of Lorentz-force motors 79, 81, 83, 85, 87 includes three Z-Lorentz-force motors 83, 85, 87, which are only diagrammatically shown in FIGS. 2 and 3, and which each belong to one of the three supporting units 67, 69, 71, respectively. The Z-Lorentz-force motors 83, 85, 87 also each include a system of permanent magnets 89, which is secured to the second part 65, and a system of electric coils 95 which is secured to the first part 57. Each of the three Z-Lorentz-force motors 83, 85, 87 generates a Lorentz-force Fz which is parallel to the Z-direction, and they jointly generate a Lorentz-force torque Mx about the first axis of rotation 73, and a Lorentz-force torque My about the second axis of rotation 75.

The linear X-motors 33, 35 and the linear Y-motor 47 of the drive unit 21 are of a relatively simple type with relatively large dimensions, so that the first part 57 can be displaced over relatively large distances and with a relatively low accuracy relative to the base BP by means of the drive unit 21 in the X-direction and the Y-direction. During such displacements of the first part 57, the second part 65 is held in position relative to the first part 57 by means of appropriate Lorentz forces of the system of Lorentz-force motors 79, 81, 83, 85, 87, while the second part 65 can also be displaced over relatively small distances relative to the first part 57 by means of the system of Lorentz-force motors 79, 81, 83, 85, 87 for positioning the substrate holder with high accuracy in six degrees of freedom with respect to the projection system PL, as measured with the aid of the interferometric displacement measuring means IF. Consequently, the positioning device 3 constitutes a two-stage positioning device having a coarse stage and a fine stage (long stroke and short stroke). The supporting units 69 and 71 are substantially identical to the supporting unit 67.

Figure 4:
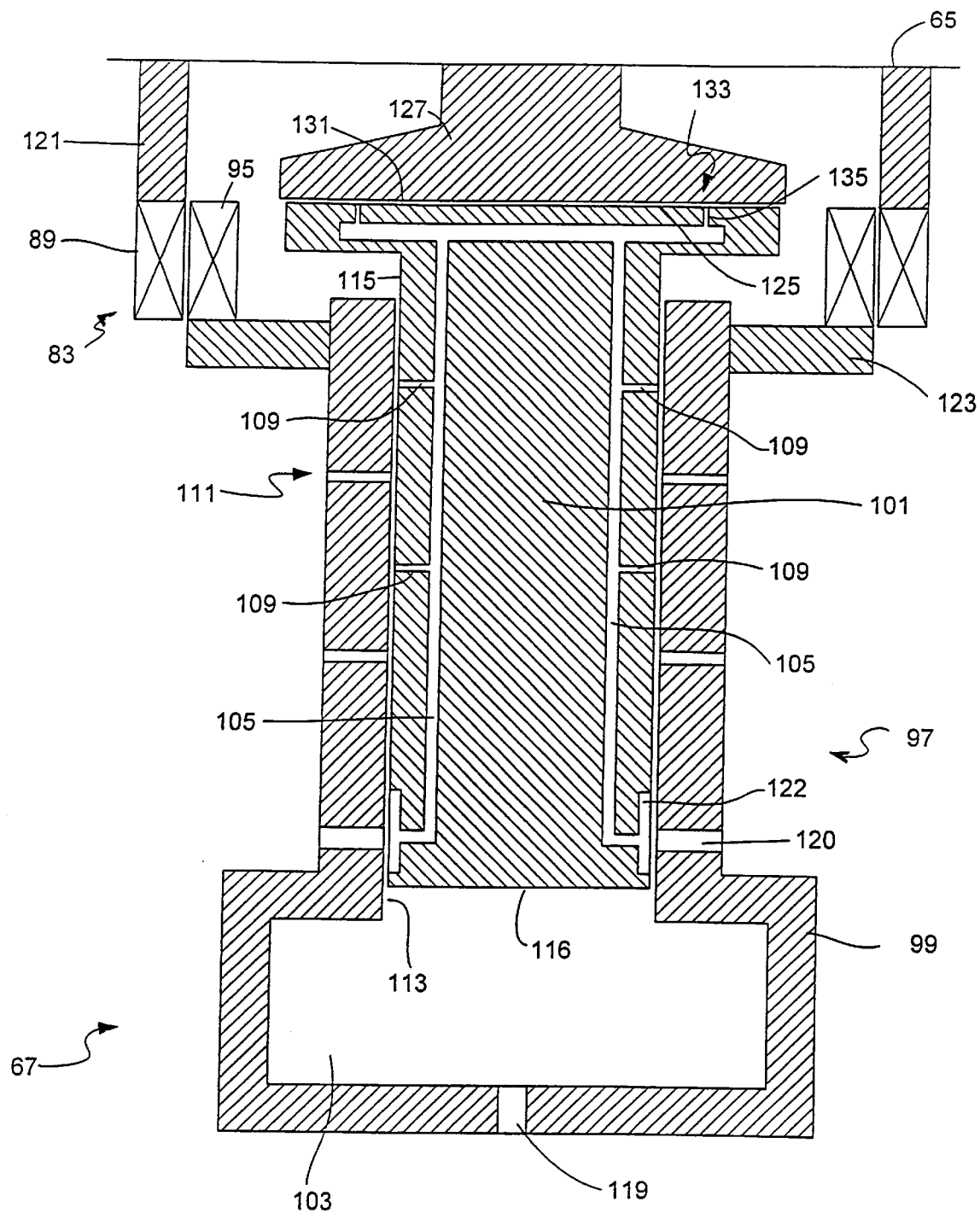
FIG. 4 is a sectional view of a supporting unit in accordance with a first embodiment of the present invention, to be used with a positioning device of FIG. 2.

FIG. 4 shows in detail a supporting unit 67 of the positioning device 3 as used in accordance with a first embodiment of the present invention. Detail of the construction of the second part 65 and the intermediate member 127 are omitted here for brevity. However, it should be noted that these parts may in practice be formed substantially as described in EP 0,973,067-A. As shown in FIG. 4, the supporting unit 67 comprises a gas cylinder 97 which is provided with a housing 99 which is secured to the first part 57, and a piston 101, which is coupled to the second part 65. A gas-filled pressure chamber, or support volume, 103 is provided in the housing 99, in which the piston 101 is guided so as to be displaceable in a direction parallel to the Z-direction. There is a small air gap between the piston and the housing which has been exaggerated in FIGS. 4–6 for clarity. Gas in the pressure chamber 103 acts on a bottom wall 116 of piston 101 to at least partially counteract gravity.

The piston 101 comprises a number of gas channels 105. A static gas bearing 111 is connected to the gas channels 105 via a number of side channels 109, which gas bearing is situated between an inner wall 113 of the housing 99 and an outer wall 115 of the piston 101. The piston 101 is journaled relative to the housing 99 in a direction perpendicular to the Z-direction by means of the static gas bearing 111.

The pressure in pressure chamber 103 is maintained by a gas supply 119 formed in the outer wall of the pressure chamber housing.

The gas bearings 111 and 133 are maintained by gas flowing from a further pressure chamber 122 adjacent to the pressure chamber 103 and surrounding the piston. This further chamber 122 is in turn supplied by a further gas supply 120 (separate from the supply 119) maintaining the pressure in the pressure chamber 122. The channels 105 feeding the gas bearings 111 and 133 emerge radially outwardly from the piston 101 to the further pressure chamber 122 which, in the embodiment shown, is formed as an annular recess in the piston 101 and is further bound by the housing 99. The height of the further chamber 122 is chosen such that it is in fluid communication with the exit from the further gas supply channel 120 formed in the housing for substantially all operating positions of the piston 101. In use, gas is supplied via supply 119 to the pressure chamber 103 to maintain a predetermined pressure in the pressure chamber 103 for supporting piston 101. A further supply of gas is provided through the channel 120 to the further pressure chamber 122 and thus to the channels 105. It is used to supply the gas bearings 111 and 133 and to maintain the pressure in the further pressure chamber 122 substantially identical to the pressure in the pressure chamber 103. The pressure in the pressure chamber 103 is maintained by a separate supply 119 and is thus insulated from the effect of gas flowing to the gas bearings 111 and 133, which will reduce pressure variations. It is hence possible for a non-steady gas flow to pass through the gas bearings 111 and 133 without affecting the static force provided by the pressure chamber 103. The non-steady gas flow for the gas bearings 111 and 133 is instead provided by the further supply 120 so that when the piston is stationary, no gas flows through the chamber 103, even when an unsteady flow is flowing through the gas bearings 111 and 133. Pressure fluctuations in further pressure chamber 122 and channels 105 act on opposing symmetrical surfaces of the piston 101 and do therefore not exert a net force on the piston. Identical pressures in pressure chamber 103 and further pressure chamber 122 prevent gas from escaping from chamber 103 along piston 101. Further chamber 122 therefore acts as a seal for the pressure chamber 103. Experiments indicate flow-induced pressure variations in the pressure chamber 103 may be reduced by a factor of at least 100. There is no physical contact between piston 101 and its housing 99 to prevent a transmission of vibrations or to increase the very low stiffness of the supporting assembly.

In this manner, the second part 65 is supported in the vertical Z-direction, relative to the first part 57 by a pneumatic supporting force which is determined by gas pressure present in the pressure chamber 103 of the gas cylinders 97 of the three supporting units 67, 69, 71.

Since the force generated by the gas cylinder remains substantially constant irrespective of piston position in the Z-direction, the gas cylinder behaves like a spring with essentially zero stiffness and the natural frequency of the suspended mass/"spring" system is essentially zero depending on the volume of the pressure-chamber 103 and the mass of the supported object. As a result of this low natural frequency, transmission of mechanical vibrations in the Z-direction, from the first part 57 to the second part 65 and the substrate holder 5 is precluded as much as possible. Mechanical vibrations may be present in the frame BF of the lithographic device and may be caused by, for example, vibrations of the floor, reaction forces of the positioning devices 3 and 9, or acoustic vibrations. Transmission of such vibrations to the substrate holder 5 would lead to undesirable inaccuracies of the position of the substrate holder 5 relative to the projection system PL.

Since the piston 101 is journalled relative to the housing 99 perpendicular to the Z-direction by means of the static gas bearing 111, the piston 101 can be moved in the Z-direction substantially without friction, so that the relatively small pneumatic stiffness of the gas cylinder 97 is not influenced substantially by frictional forces of the static gas bearing 111 exerted on the piston 101. It is noted also that substantially no mechanical vibrations are transmitted from the first part 57 to the second part 65 via the system of Lorentz-force motors 79, 81, 83, 85, 87, because there is no mechanical contact between the systems of permanent magnets 79, 89 and the system of electric coils 81, 95, and because Lorentz-force motors supply a Lorentz force which does not change substantially in the case of relatively small displacements of the systems of permanent magnets 79, 89 relative to the systems of electric coils 81, 95.

As mentioned above, the three Z-Lorentz-force motors 83, 85, 87 each belong to one of the three supporting units 67, 69, 71, respectively, the three gas cylinders 97 each forming a supporting unit 67, 69, 71 with one of the Z-Lorentz-force motors. As shown in FIG. 4, the system of permanent magnets 89 of the Z-Lorentz-force motor 83 is secured to the second part 65 by means of a coupling member 121, which is only schematically shown, and which is substantially undeformable at least in the Z-direction. The system of electric coils 95 of the Z-Lorentz-force motor 83 is secured to the housing 99 of the gas cylinder 97 via a securing member 123. In this manner, a practical and compact construction of the positioning device 3 is obtained, the three gas cylinders 97 providing for a stable and statically determined support (against gravity) of the second part 65 relative to the first part 57, in the vertical Z-direction.

As is further shown in FIG. 4, the piston 101 is provided with a supporting surface 125 extending at right angles to the Z-direction. The supporting unit 67 of the positioning device 3 is further provided with an intermediate part 127 which is secured to the second part 65 by any appropriate means. The intermediate part 127 includes a guide surface 131, which also extends at right angles to the Z-direction, and which bears on the supporting surface 125 of the piston 101 via a further static gas bearing 133. As shown in FIG. 4, the further static gas bearing 133, just like the static gas bearing 111, is connected via a number of side channels 135 to the gas channels 105 which are provided in the piston 101 and communicate with the pressure chamber 103. The second part 65 is guided over the supporting surface 125 substantially without friction in directions at right angles to the Z-direction, by means of the further static gas bearings 133. Movement of the second part 65 is thus rendered independent of the support units 67, 69, 71, and only determined by the Lorentz-force motors. A detailed construction of intermediate part 127 may be found in EP 0,973,067-A.

As can be seen in FIG. 4, the pressure chamber 103 is supplied by supply passage 119 whereas the channels 105 are supplied by supply passage 120. Thus, the supply of gas to the gas bearings 111 and 133 is independent of the supply of gas to the pressure chamber 103. Thus, variations in the flow of gas in the gas bearings only affects the gas flowing through supply 120 and not the gas flowing through supply 119. Thus, even when the flow through the gas bearings changes, the pressure in chamber 103 remains substantially constant and a static force is provided to counteract the gravitational force due to the weight of the second part 65 and the piston 101.

Figure 6:
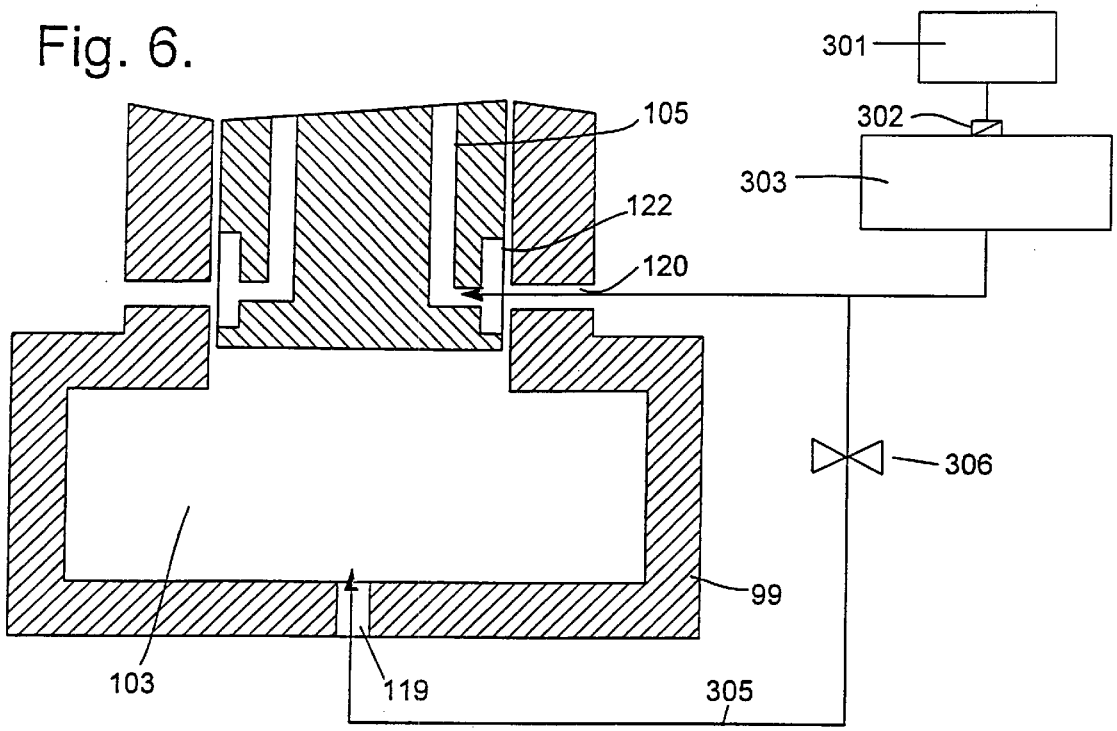
FIG. 6 is a close-up view of part of FIG. 4 showing a gas supply system used with the first embodiment of the invention.

FIG. 6 shows a close-up view of the pressure chamber 103 and bottom portion of the piston 101 as shown in FIG. 4. The gas supply arrangement is also shown.

In FIG. 6, 301 indicates the gas supply (e.g. an air supply) which may be a gas bottle or a pumped source in which a large tank is filled by a pump. The large tank acts a capacitive filter to reduce pressure ripples from the pump. Whichever source is used, the output is controlled by regulator valve 302 which can be a single valve or a cascade of valves and can be either mechanical (passive) or electronic (e.g. piezoelectric, voice coil actuated, etc.) and servo controlled to a fixed reference level or an optimized, variable value, e.g. to minimize motor current. Such an arrangement will provide a substantially stable pressure, largely independent of flow rate. However, further stabilization of the air supply is desirable.

To further regulate the air pressure, a large volume pre-chamber 303 is fed from the regulator valve 302. Pre-chamber 303 has a large volume compared to the actual volume of the gravity compensator, including the cylinder 103. The pre-chamber 303, air supply 301 and regulator valve 302 may be situated at a relatively large distance from the actual object to be supported.

The compressed air is fed from the chamber 303 directly to the supply 120 and via pneumatic resistor 306 to supply 119. Pneumatic resistor 306 produces a pressure drop as a function of flow rate, the pressure drop being virtually zero in a substantially stationary state. The pneumatic resistor may be a frictional resistance such as a long capillary tube or an inertial resistance such as an orifice. Air from the chamber 303 is fed to the pressure chamber 103 via tubing 305 which is preferably made as short and smooth as possible, with minimal sharp turns, edges and other turbulence-creating feature (the diagram is purely schematic). This arrangement provides the equivalent of a resistance-capacitance circuit, forming a low pass filter to further reduce residual high-frequency pressure disturbances at the outlet of the regulator.

In a variation of the above described embodiment, the supporting assembly shown in FIG. 4 can be supported directly on the base BP (see FIGS. 1 and 3) rather than via the first part 57 which part is able to slide over base plate BP. The Lorentz-force motors may still be positioned between the first and second parts however.

Embodiment 2

Figure 5:
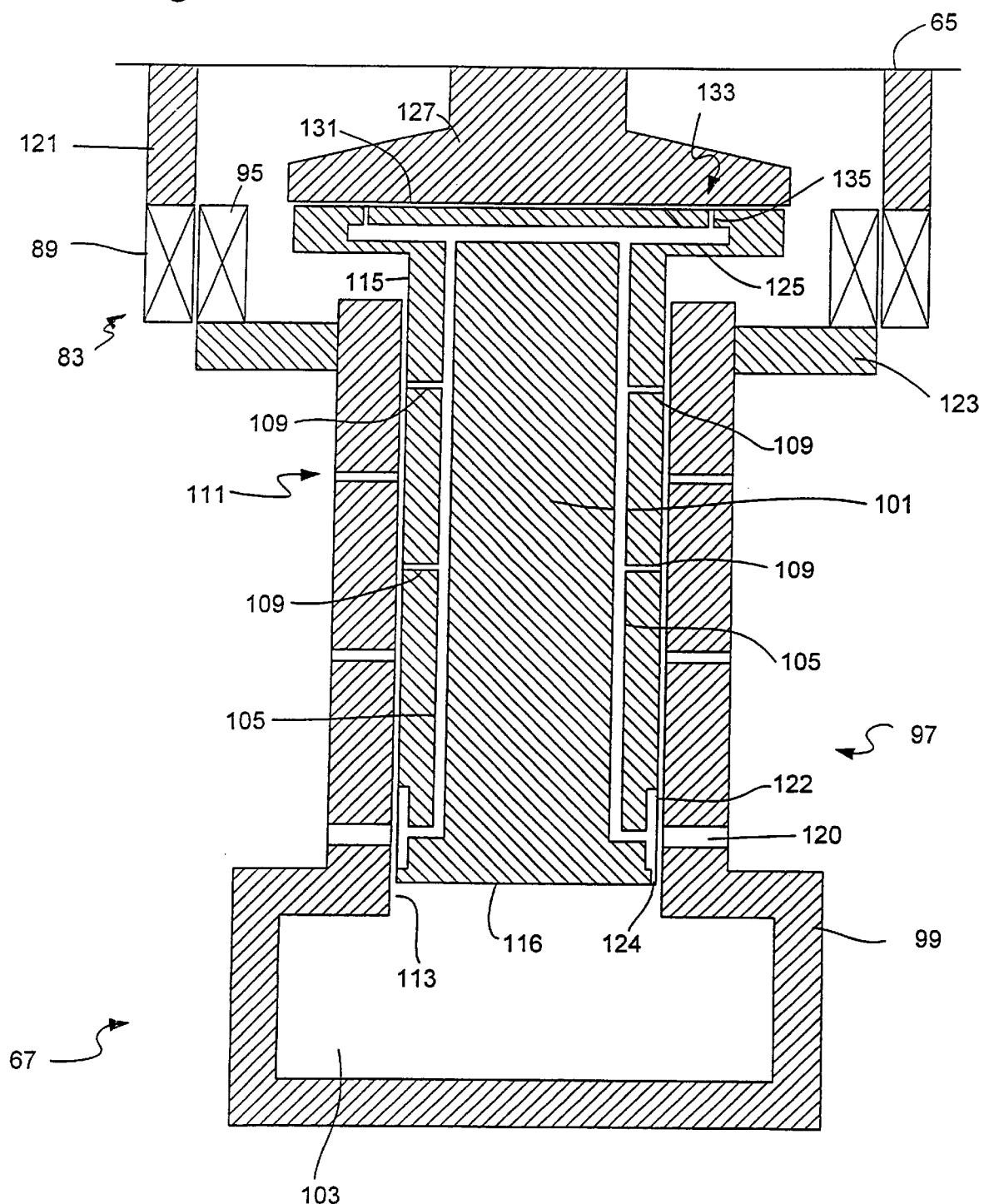
FIG. 5 is a sectional view of a supporting unit in accordance with a second embodiment of the present invention, to be used with a positioning device of FIG. 2.

FIG. 5 shows a gas cylinder similar to that of FIG. 4 but with a modified supply of gas to the pressure chamber. Instead of the gas being supplied completely separately from the gas supply to the gas bearings the same effect can be achieved by supplying the pressure chamber with a feed taken from further pressure chamber 122. This is achieved by passing a portion of the gas bearing supply gas through a restriction 124 (which acts as a pneumatic resistor) formed between the outside of the piston 101 and the inside of the first part 99. Gas therefore flows in the channel 120 to the gas bearing in the same way as in the embodiment of FIG. 4. However, gas is also allowed to travel through the small restriction 124 formed by the cylindrical gap between the outside edge of the piston 101 and the inner wall 113 of housing 99 to supply the pressure chamber 103, which replaces supply 119 according to FIG. 4.

Figure 7:
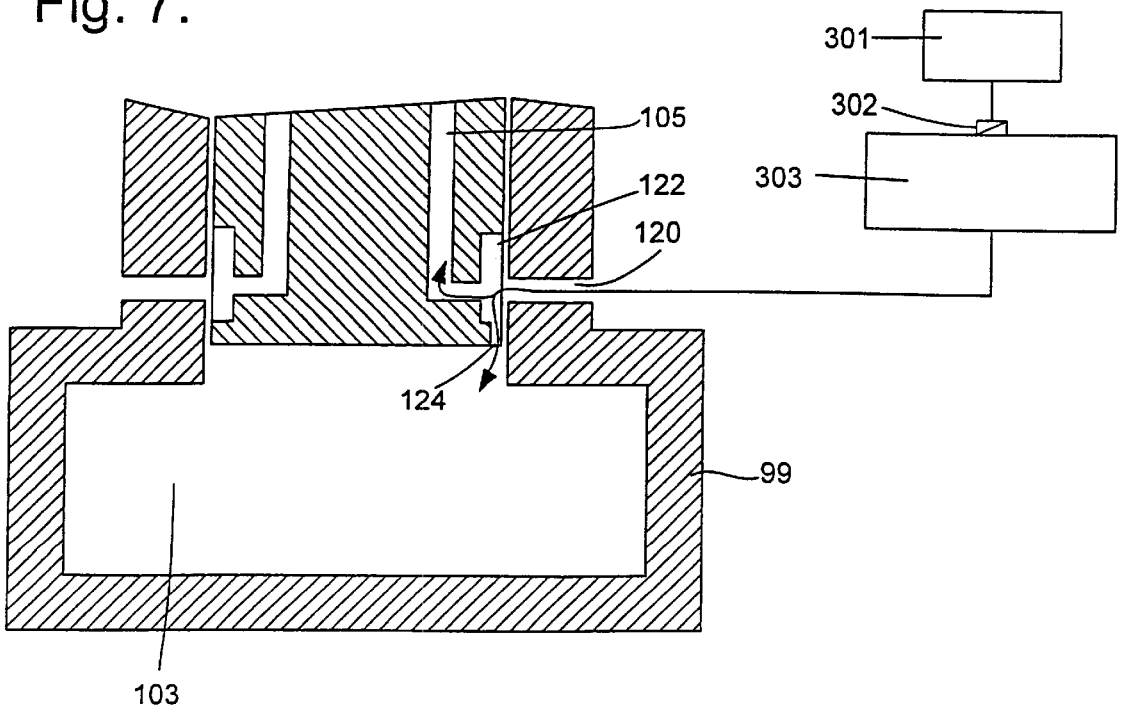
FIG. 7 is a close-up view of part of FIG. 5 showing a gas supply system used with the second embodiment of the invention.

FIG. 7 shows a close-up view of the bottom of the housing shown in FIG. 5. The air supplies 301, regulator valve 302 and large volume pre-chamber 303 are substantially the same as described with reference to FIG. 6. However, in this embodiment a single tube is used to supply gas to the channel 120 formed in the housing 99. As indicated by the arrows, the gas flow splits so that some gas flows to the channel 105 to supply the gas bearings 111 and 135 whereas the remainder of the flow is used to supply the pressure chamber 103. The gap 124 through which this remainder flows is small enough to act as a pneumatic resistor, equivalent to resistor 306 in FIG. 6, which causes a pressure drop proportional to the flow rate. This serves to further stabilise the pressure maintained in the chamber 103. This arrangement is advantageous because it obviates the need for a separate supply 119 to the pressure chamber. The pneumatic resistor 124 serves to insulate the pressure chamber from flow variation caused by differing flows through the gas bearings 111 and 135.

Embodiment 3

This embodiment may be constructed substantially identically to either of the embodiments described above and shown in FIGS. 4 to 7. The difference lies in the fact that the supporting assembly is used to support the metrology frame MF on the base frame BF (see FIG. 1). Referring to FIG. 4, in this embodiment, the metrology frame MF is rigidly connected to the second part 65 and the base frame is rigidly connected to the housing 99. In this way, the present invention may be used as an air mount to support the metrology frame MF (which itself supports the projection system PL) relative to the base frame BF.

Although this text has concentrated on lithographic apparatus and methods whereby a mask is used to pattern the radiation beam entering the projection system, it should be noted that the invention presented here should be seen in the broader context of lithographic apparatus and methods employing generic "patterning structure" to pattern the said radiation beam. The term "patterning structure" as here employed refers broadly to means that can be used to endow an incoming radiation beam with a patterned cross-section, corresponding to a pattern that is to be created in a target portion of the substrate; the term "light valve" has also been used in this context. Generally, the said pattern will correspond to a particular functional layer in a device being created in the target portion, such as an integrated circuit or other device. Besides a mask on a mask table, such patterning means include the following exemplary embodiments:

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

A programmable LCD array. An example of such a construction is given in U.S. Pat. No. 5,229,872, which is incorporated herein by reference.

Moreover, a positioning device can be used, not only in a lithographic device, but also in other devices in which an object must be held in an accurate position or must be moved or positioned in an accurate manner by means of the positioning device.

Accordingly, the supporting assembly according to the invention can be employed more broadly than described in the above embodiments. It is envisaged that said assembly is not only suitable for use in lithographic projection apparatus but can also be applied in devices in which a supported structure needs supporting to accurately counteract the weight of said supported structure with minimal vibration transmission. Examples of such devices include accurate processing machines or analytic equipment.

What is claimed is:

1. A lithographic projection apparatus comprising:
   a radiation system to supply a projection beam of radiation;
   a first object table provided with a first object holder to hold a mask;
   a second object table provided with a second object holder to hold a substrate; and
   a projection system to image an irradiated portion of the mask onto a target portion of the substrate;
   at least one of said first and second object tables being connected to positioning structure constructed and arranged to position said one object table with respect to the projection system, wherein the apparatus further comprises a supporting assembly comprising:
   a moveable member associated with a supported structure;
   a housing in which said moveable member is journalled such that substantially no vibration forces are transmitted between said moveable member and said housing;
   a gas-filled pressure chamber, the gas in said pressure chamber acting on said moveable member so as to at least partially counteract a force due to weight of the supported structure; and
   a gas supply to supply gas to said pressure chamber;
   the supporting assembly being constructed and arranged such that substantially no gas flows through the pressure chamber when said moveable member is substantially stationary.

2. A lithographic projection apparatus according to claim 1, wherein the supporting assembly further comprises:
   a further gas-filled pressure chamber adjacent to said pressure chamber and at least partially surrounding said moveable member;
   a further gas supply to supply to said further pressure chamber such that a gas pressure in said pressure chamber is substantially identical to a gas pressure in said further pressure chamber when said moveable member is substantially stationary.

3. A lithographic projection apparatus according to claim 2, wherein said gas supply and said further gas supply are combined.

4. A lithographic projection apparatus according to claim 3, wherein the supporting assembly further comprises a pneumatic resistor comprising a gap formed between said moveable member and an opposite wall connecting said pressure chamber and said further pressure chamber.

5. A lithographic projection apparatus according to claim 2, wherein the supporting assembly further comprises at least one gas bearing and said moveable member comprises a channel in fluid communication with said further gas supply to supply gas to said at least one gas bearing.

6. A lithographic projection apparatus according to claim 1, wherein the positioning structure comprises the supporting assembly and the supported structure is one of said object tables.

7. A lithographic projection apparatus according to claim 1, wherein the apparatus further comprises:
   a metrology frame to support said projection system; and
   a base frame to support said metrology frame, said metrology frame being supported with respect to said base frame by the supporting assembly, wherein the supported structure is said metrology frame.

8. A supporting assembly comprising:
   a moveable member associated with a supported structure;
   a housing in which said moveable member is journalled, said journalling being such that substantially no vibration forces are transmitted between said moveable member and said housing;
   a gas-filled pressure chamber, the gas in said pressure chamber acting on said moveable member so as to at least partially counteract the force due to the weight of the supported structure; and
   a gas supply to supply gas to said pressure chamber;
   the supporting assembly being constructed and arranged such that substantially no gas flows through the pressure chamber when said moveable member is substantially stationary.

9. A supporting assembly according to claim 8, wherein the supporting assembly further comprises:
   a further gas-filled pressure chamber adjacent to said pressure chamber and at least partially surrounding said moveable member;
   a further gas supply to supply gas to said further pressure chamber such that a gas pressure in said pressure chamber is substantially identical to a gas pressure in said further pressure chamber when said moveable member is substantially stationary.

10. A method of manufacturing a device using a lithographic projection apparatus comprising:
    providing a substrate that is at least partially covered by a layer of radiation-sensitive material;
    projecting an image of at least part of a mask pattern onto a target portion of the layer of radiation-sensitive material;
    providing a moveable member associated with a supported structure;
    providing a housing in which said moveable member is journalled such that substantially no vibration forces are transmitted between said moveable member and said housing;
    providing a gas-filled pressure chamber, the gas in said pressure chamber acting on said moveable member so as to at least partially counteract the force due to the weight of the supported structure; supplying gas to the pressure chamber; and
    preventing gas from flowing through said pressure chamber when said moveable member is substantially stationary.

11. A method according to claim 10, further comprising the steps of:
    providing a further pressure chamber adjacent to said pressure chamber and at least partially surrounding said moveable member;
    supplying gas to said further pressure chamber such that a gas pressure in said pressure chamber is substantially identical to a gas pressure in said further pressure chamber when said moveable member is substantially stationary; and
    ensuring a gas pressure in said pressure chamber is substantially identical to a gas pressure in said further pressure chamber.

12. A lithographic projection apparatus comprising:

a radiation system to supply a projection beam of radiation;

a first object table provided with a first object holder to hold a mask;

a second object table provided with a second object holder to hold a substrate; and a projection system to image an irradiated portion of the mask onto a target portion of the substrate;

at least one of said first and second object tables being connected to positioning structure constructed and arranged to position said one object table with respect to the projection system, wherein the apparatus further comprises a supporting assembly comprising:

a moveable member associated with a supported structure;

a housing in which said moveable member is journalled such that substantially no vibration forces are transmitted between said moveable member and said housing;

a gas-filled pressure chamber, the gas in said pressure chamber acting on said moveable member so as to at least partially counteract a force due to weight of the supported structure; and a gas supply to supply gas to said pressure chamber;

the supporting assembly including means for preventing gas from flowing through the pressure chamber when said moveable member is substantially stationary.

* * * * *